United States Patent [19]

Anthony

[11] Patent Number: 4,542,518
[45] Date of Patent: Sep. 17, 1985

[54] ELECTRONIC BLOOD CELL COUNTER

[76] Inventor: Thomas E. Anthony, 4128 John Goff, Watervliet, Mich. 49098

[21] Appl. No.: 438,643

[22] Filed: Nov. 3, 1982

[51] Int. Cl.[4] .......................................... G06M 11/00
[52] U.S. Cl. ......................................... 377/10; 364/416
[58] Field of Search ...................... 377/10, 2; 364/555

[56] References Cited

U.S. PATENT DOCUMENTS

| Re. 27,902 | 1/1974 | Estelle et al. | 235/92 PC |
|---|---|---|---|
| 2,661,902 | 12/1953 | Wolff et al. | 235/98 |
| 3,740,143 | 6/1973 | Groner et al. | 356/39 |
| 3,811,036 | 5/1974 | Perry | 235/92 PC |
| 3,916,205 | 10/1975 | Kleinerman | 250/461 |
| 3,922,532 | 11/1975 | Kitchener et al. | 235/150.3 |
| 3,968,351 | 7/1976 | Baker | 235/92 PC |
| 3,973,725 | 8/1976 | Watanabe et al. | 235/92 PC |
| 4,071,891 | 1/1978 | Barrows | 377/10 |
| 4,080,575 | 3/1978 | Miki | 328/129.1 |
| 4,139,303 | 2/1979 | Carlson et al. | 356/39 |
| 4,218,610 | 8/1980 | Baxter, Jr. et al. | 235/92 PC |
| 4,240,029 | 12/1980 | Haynes | 324/71 CP |
| 4,325,706 | 4/1982 | Gershman et al. | 23/230 B |

Primary Examiner—John S. Heyman
Assistant Examiner—K. Ohralik
Attorney, Agent, or Firm—Price, Heneveld, Huizenga & Cooper

[57] ABSTRACT

The specification discloses an electronic manually operated blood cell counter including continuous count capability in response to a single key depression for recording large number of similar cells during a differential count. More specifically, the counter includes microprocessor control for periodically incrementing a counter in response to sustained depression of a manually actuated counting switch. The control is adjustable to vary the speed at which the counter is periodically incremented to accommodate individual laboratory technicians.

6 Claims, 4 Drawing Figures

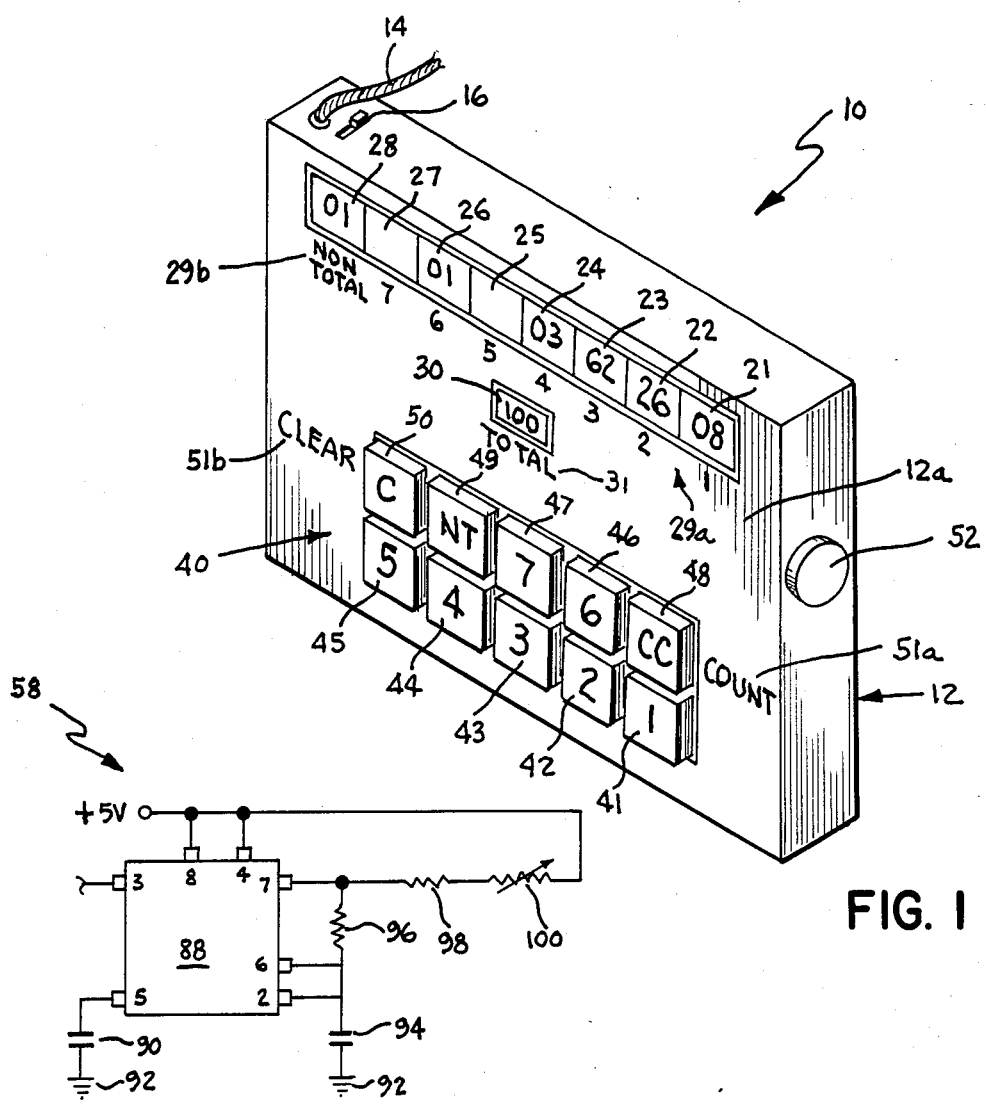
FIG. 1
FIG. 3
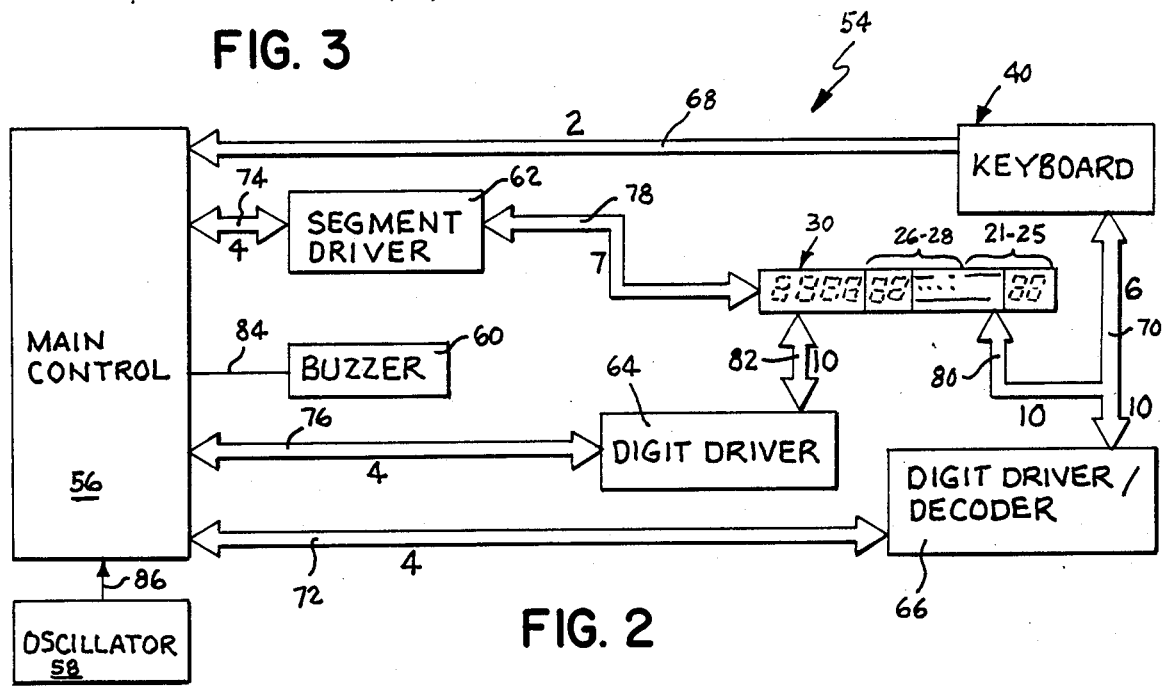
FIG. 2

ELECTRONIC BLOOD CELL COUNTER

BACKGROUND OF THE INVENTION

The present invention relates to blood cell counters and more particularly to electronic blood cell counters.

The differential tally is a basic tool used in all medical laboratories during microscopic examination of a prepared blood field for counting and differentiating blood cells. More specifically, the blood to be examined is prepared on a slide, which is then placed under a microscope for examination. For a 100-cell differential, the laboratory technician then examines the blood and observes 100 blood cells at random. As the slide is examined, the technician counts and accumulates a subtotal for each type of cell encountered. After 100 cells have been counted, the various subtotals provide a percentage indication of the cell types making up the sample.

Differential tallies, both mechanical and electronic, have been developed to facilitate counting of the blood cells observed during the differential count. Typically, such a machine includes six to eight data entry keys each of which is connected to a two-digit display, a separate display showing the total of the two-digit displays (e.g., total number of cells counted), an audible signal generator to sound an alarm when the total count reaches 100. An entry on any one of the data entry keys will increment both the display associated with that key and the "total" display. When the audible signal sounds, indicating that the total count has reached 100, the technician then reads the two-digit displays which then show the percentage of each type of cell observed during the count. Often, the tallies include a "nontotal" key and associated display used to count cells observed during the count which are not to affect the "total" display.

In addition to the described 100-cell differential counts, the technician is often required to perform counts (e.g., spinal fluid counts, platelet counts, and reticulocyte counts) requiring the counting of over 1,000 cells. These differential counts involving large numbers of cells are typically performed using either a hand-held manual counter or a differential tally of the type described above. However, both the hand-held manual counters and known differential tallies require a key depression for the registration on the tally of each cell observed during the count. This method of data entry is extremely laborious, tedious, and boring to the laboratory technician performing the count. Further, error may creep into the count results due to differences between the count occurring in the technician's mind and that being recorded by the technician's fingers.

SUMMARY OF THE INVENTION

The aforementioned problems are solved by the present invention comprising an electronic differential tally including a "continuous count" key for continuously periodically incrementing the "total" count so long as the continuous count key remains depressed. Consequently, the laboratory technician need not depress key each time that an entry is to be made. The technician simply depresses the continuous count key and leaves the key depressed until the total count has been adequately incremented for all similar cells sequentially observed. The tedium of performing a differential count is greatly alleviated because the number of key depressions required to complete a large count is greatly induced.

These and other objects, advantages, and features of the invention will be more fully understood and appreciated by reference to the written specification and appended drawings.

BRIEF DESCRIPTION OF THE DRAWINGS

FIG. 1 is a perspective view of the differential tally of the present invention;

FIG. 2 is a schematic diagram showing the electronic circuitry of the differential tally;

FIG. 3 is a detailed schematic view of the oscillator; and

DETAILED DESCRIPTION OF THE PREFERRED EMBODIMENT

Figure 4:
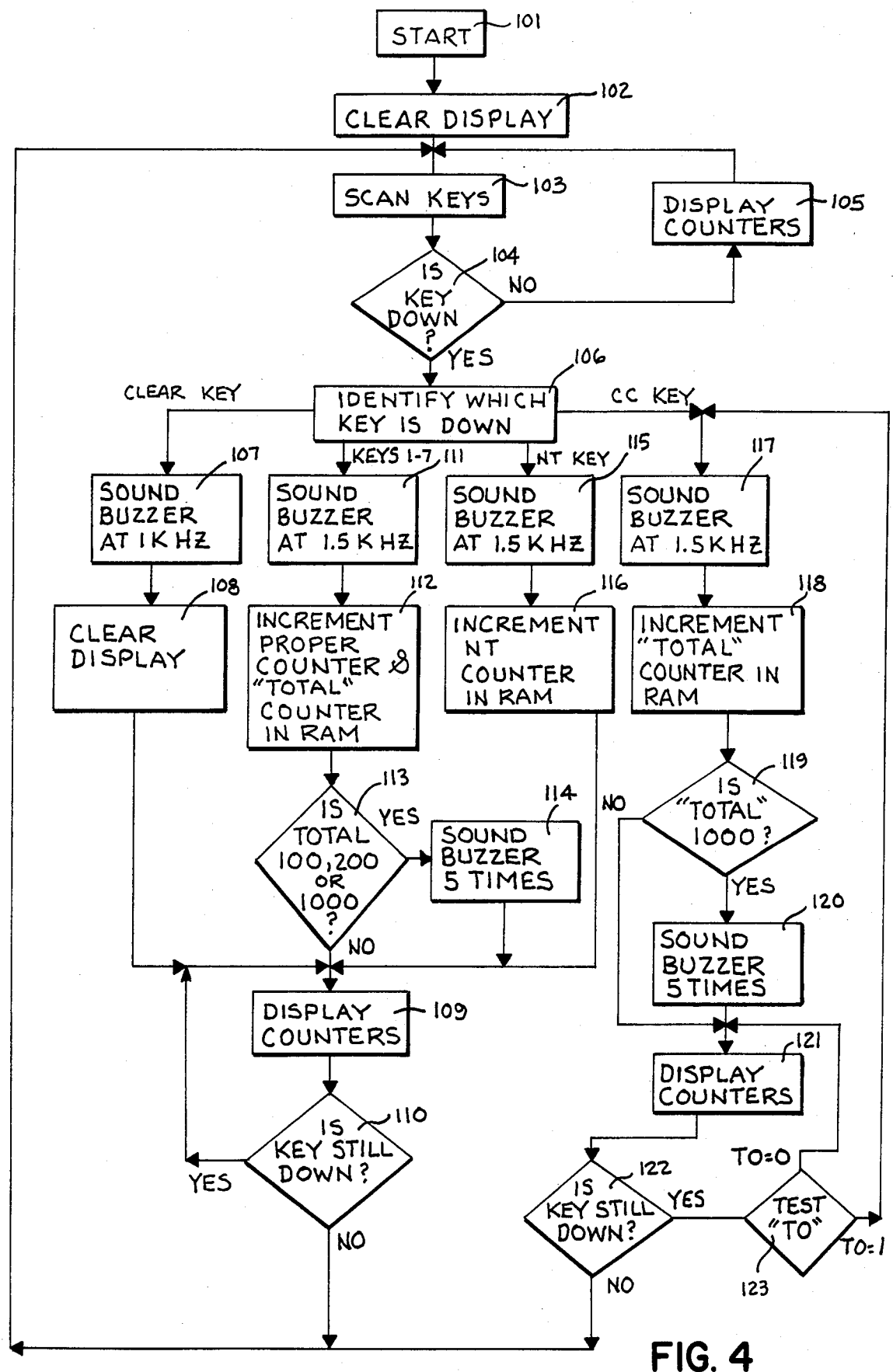
FIG. 4 is a flow diagram of the microprocessor program controlling the operation of the differential tally.

A differential tally constructed in accordance with a preferred embodiment of the invention is illustrated in FIG. 1 and generally designated 10. Briefly, tally 10 includes housing 12, bank 20 of "subtotal" displays, "total" display 30, keyboard 40, and rate control adjustment knob 52. Keyboard 40 includes "continuous count" key 48 which, when depressed, causes the continual periodic incrementation of "total" display 30. The rate at which "total" display 30 is incremented in response to depression of continuous count key 48 may be varied by the technician by adjusting rate control knob 52. Therefore, the technician can select an incrementation rate which is comfortable for the technician for the procedure being performed. When used for a large (e.g., 1000 cell) differential count, the large number of similar cells are registered by depressing continuous count key 48 and holding the key depressed to periodically increment "total" display 30 until the appropriate number of audio signal comfirmations are heard. The unusual cells (e.g., reticulocytes) encountered during the differential count may be registered by depressing one of the other keys of keyboard 40.

Turning more specifically to the construction of tally 10, housing 12 supports in its upper face 12a displays 20 and 30 and keyboard 40 for easy reading and actuation by the laboratory technician. Power cord 14 and power switch 16 are mounted on rear face 12b of the housing to selectively supply power to tally 10 in a well-known manner. Bank 20 of subtotal displays in turn comprises eight LED two-digit displays denominated 21–28. Displays 21–27 are identified by numbers 29a printed on housing 12 directly below each display. Display 28 is identified by the word 29b "NONTOTAL". "Total" display 30 is a four-digit LED display located under bank 20 and is identified by the word 31 "TOTAL".

Keyboard 40 includes ten spring-loaded keys 41–50 each including a depressed actuated state and a released unactuated state. Keys 41–47 bear the numerical designations 1–7, respectively, while keys 48, 49, and 50 bear the designations CC, NT, and C, respectively. Further, the word "COUNT" 51a and "CLEAR" 51b are printed on housing 12 proximate keys 48 and 50, respectively, to further identify these keys. Through microprocessor control, depression of any one of keys 41–47 and 49 causes the associated display 21–28, respectively, to be incremented. Additionally, depression of any one of keys 41–47 causes "total" display 30 to also be incremented. Actuation of "clear" key 50 causes all the displays 21–28 and 30 to be blanked as is required at the initiation of each individual count. The depression of "continous count" key 48 causes "total" display 30 to be incremented at a periodic rate as long as the key remains depressed. This rate may be adjusted by rotating knob 52 extending from housing 12.

The electronic circuitry for tally 10 is illustrated in FIG. 2 and generally designated 54. More particularly, circuitry 54 includes microprocessor 56, oscillator 58, buzzer 60, segment driver 62, and digit driver 64 and digit driver/decoder 66. In the preferred embodiment, microprocessor 56 is an INTEL 8748 chip; segment driver 62 is an INTEL 4511 chip; digit driver 64 and digit driver/decoder 66 are INTEL 7445 chips. Keyboard 40 is connected to microprocessor 56 by a two-line bus 68 and to driver/decoder 66 by a six-line bus 70. Driver/decoder 66 is in turn connected to microprocessor 56 by a four-line bus 72. Consequently, a depressed key on keyboard 40 can be identified by microprocessor 56 by examining the signals received on buses 68 and 72. Segment driver 62 and digit driver 64 are connected to microprocessor 56 through four-line buses 74 and 76, respectively. Segment driver 62 is further connected to each of the numerals in displays 20 and 30 via a seven-line bus 78. Digit driver/decoder 66 is connected to displays 21–25 via ten-line bus 80, and digit driver 64 is connected to displays 26–28 and 30 via ten-line bus 82. Using techniques well known to those having ordinary skill in the art, microprocessor 56 is programmed to multiplex segment driver 62, digit driver 64, and digit driver/decoder 66 to display numbers on displays 21–28 and 30. Additionally, microprocessor 56 also controls buzzer 60 through line 84 and receives a periodic signal from oscillator 58 through line 86. In particular, microprocessor 56 includes a RAM counter associated with each of displays 21–28 and 30 to store the values to be shown in the display.

The detailed description of oscillator 58 is illustrated in FIG. 3. The oscillator comprises a 555 timer chip—for example, an INTEL 555. As is well known, to produce a periodic output at pin 3, pin 5 is connected to ground 92 through 0.1 microfarad capacitor 90. Similarly, pins 2 and 6 are grounded through a 0.68 microfarad capacitor 94. Pins 4 and 8 are connected to a five-volt power source. Pin 7 is connected through a 47 kilo-ohm resistor 96 to pins 2 and 6. Pin 7 is connected in series through a 220 kilo-ohm resistor 98 and a 1 mega-ohm rheostat or pot 100 to the five-volt power source. The rheostat 100 is adjusted by rotating knob 52 extending from housing 12 (see FIG. 1). With the components specified in FIG. 3, rheostat 100 can be adjusted to provide a periodic binary or digital signal at pin 3 having a frequency between approximately 80 cycles per minute and approximately 360 cycles per minute.

OPERATION

The control of differential tally 10 is illustrated in the flow chart of FIG. 4. Using well-known programming techniques, the components of circuitry 54 can be programmed by one having ordinary skill in the art to implement the control flow illustrated in the FIG. 4 flow chart. When power is supplied to the tally by connecting cord 14 to a power source and turning on switch 16 (see FIG. 1), execution of the program begins at block 101 whereupon displays 21–28 and 30 are cleared 102. Keyboard 40 is then scanned 103 to detect a key depression, and a test 104 is conducted to determine whether a key is down. If a key is not down, the various counters within microprocessor 56 are displayed 105 on displays 20 and 30 before control returns to block 103. If decision 104 indicates that a key has been depressed, control passes to block 106 where the depressed key is identified and an appropriate branch is made depending upon the depressed key.

If the "clear" key 50 is depressed as determined at 106, microprocessor 56 causes buzzer 60 to sound 107 at a frequency of approximately 1 kilo-hertz to provide audio confirmation of the key depression, and displays 20 and 30 are cleared 108. The program then enters a loop where the counters within microprocessor 56 are displayed 109 on displays 20 and 30 until the key is released 110. When the key is released, control returns to block 103 where the keys are again scanned for the next key depression.

If any one of keys 41–47 are depressed as determined at 106, buzzer 60 is sounded 111 at a frequency of approximately 1.5 kilo-hertz to provide an audio, relatively high pitch, confirmation of the key depression. Control then passes to block 112 where the proper counter associated with the depressed key is incremented and additionally the "total" counter is incremented. The "total" counter is then tested 113 to determine whether it equals 100, 200, or 1,000. If the total equals one of these numbers, buzzer 60 is sounded 114 five times and the keyboard is disabled for three seconds to indicate that the appropriate total has been reached. After either a negative decision at block 113 or sounding 114 of buzzer 60, the program enters a loop wherein the counters are displayed 109 until the key is released 110, at which time control returns to block 103.

If it is determined at block 106 that the "nontotal" or NT key 49 has been depressed, buzzer 60 is sounded 115 at the higher pitch frequency of approximately 1.5 kilo-hertz. The NT counter in microprocessor 56 is then incremented 116; the "total" counter is not affected. Control then passes to blocks 109 and 110 where the counters are displayed until the key is released, whereupon control returns to block 103.

If the "continuous count" or CC key 48 is depressed as determined at 106, buzzer 60 is sounded 117 at the higher pitched 1.5 kilo-hertz frequency. The "total" counter in microprocessor 56 is incremented 118 and compared 119 to determine whether it has reached the 1,000 figure. If it has, buzzer 60 is sounded 120 five times and the keyboard is disabled for three seconds to indicate that the 1,000 total has been reached. After either a negative decision at block 119 or the sounding 120 of buzzer 60, the counters are displayed 121 and a test 122 is conducted to determine whether the CC key is still depressed. If the key has been released, control passes to block 103. If the key has not been released, a second test 123 is conducted to determine whether the signal received on line 86 from oscillator 58 has changed to binary one. If the signal is zero, control returns to block 121. If the signal is one, control returns to block 117 to again sound buzzer 60 and increment the "total" counter.

In use, the laboratory technician positions differential tally 10 on the lab bench at a position conveniently proximate the microscope used during the differential count. When a test is to be initiated, "clear" key 50 is depressed so that all of displays 20 and 30 and their associated counters in microprocessor 56 are reset to zero. If any one of the counters associated with displays 20 is zero, microprocessor 56 blanks that appropriate display as shown at blank displays 25 and 27 to reduce confusion in reading the displays.

If a 100-cell differential is to be conducted, the lab technician scans the blood smear and sequentially depresses keys 41–47 indicating up to seven different types of cells encountered. The depression of any one of these keys will increment the associated display 21–27 and the "total" display 30. Additionally, buzzer 60 is sounded whenever one of keys 41–50 is depressed to provide an audio confirmation of the data registration to the technician. This audio confirmation greatly improves the accuracy of the data recording process. Additionally, if the technician notes a cell which is not to contribute to "total" display 30, NT key 49 is depressed to increment display 28 without affecting display 30. When "total" counter 30 has reached 100, buzzer 60 will be sounded by microprocessor 56, indicating to the technician that the test is complete. The technician then reads displays 21–27 to record the percentage of each particular type of cell encountered during the test. The results illustrated in FIG. 1 would be interpreted as follows:

| Type | Percent |
|---|---|
| 1 | 8 |
| 2 | 26 |
| 3 | 62 |
| 4 | 3 |
| 5 | 0 |
| 6 | 1 |
| 7 | 0 |
| Total | 100 |

Additionally, it is noted on display 28 that one "nontotal" cell was encountered during the test.

When tally 10 is utilized in a large number differential count (e.g., a reticulocyte count), only the "continuous count" key 48 and one of keys 41–47 will be depressed after "clear" key 50. Because of its proximity to the "continuous count" key 48, it is expected that key 41 will most often be used in conjunction with the "continuous count" key during a large number count. The large number of similar cells encountered are recorded on the differential tally 10 by depressing "continuous count" key 48 and allowing microprocessor 56 to incrementally update "total" counter and display 30. Each time that the "total" counter is incremented in response to depression of key 48, buzzer 60 is sounded to provide an audible confirmation to the laboratory technician of the incrementation. Therefore, the technician can simply maintain the key depressed until the appropriate number of audible signals are heard corresponding to the number of similar cells observed. The relatively low number of dissimilar cells encountered during the differential count are recorded by depressing the selected one of keys 41–47 which increments the counter in display 21–27 associated with that key and also the "total" counter and display 30. Rate control knob 52 may be rotated to vary the period of oscillator 58 to vary the speed at which "total" counter and display 30 is incremented. Accordingly, the technician can select a rate which is comfortable for the particular procedure being conducted.

It should be understood that the above description is intended to be that of a preferred embodiment of the invention. Various changes and alterations might be made without departing from the spirit and broader aspects of the invention as set forth in the appended claims, which are to be interpreted in accordance with the principles of patent law, including the doctrine of equivalents.

The embodiments of the invention in which an exclusive property or privilege is claimed are defined as follows:

1. A manually operated blood cell counter comprising:
   means for storing first and second numerical values;
   first and second incrementing means for incrementing said first and second numerical values, respectively;
   first and second manually actuated switches each including an actuated state;
   oscillator means for producing a periodic signal; and
   control means responsive to said switches and said oscillator means for actuating said first incrementing means once during each cycle of said periodic signal when said first switch is in said actuated state, whereby said numerical value is periodically incremented while said first switch is in said actuated state, said control means further including means responsive to said second switch for actuating both of said incrementing means once when said second switch enters said actuated state.

2. A blood cell counter as defined in claim 1 wherein said oscillator means includes means for manually adjusting the frequency of said periodic signal.

3. A blood cell counter as defined in claim 2 wherein said frequency is adjustable between about eighty and about three hundered sixty cycles per minute.

4. A manually operated blood cell counter comprising:
   means for storing a total numerical value;
   means for storing a second numerical value;
   first means for incrementing said total value;
   second means for incrementing said second value;
   first and second manually operable switch means each including an acutated state;
   oscillator means for producing a periodic signal; and
   control means responsive to said first and second switch means and to said oscillator means for actuating both said first and second incrementing means when said second switch enters said actuated state and for actuating only said first incrementing means once during each cycle of said periodic signal when said first switch is in said actuated state.

5. A blood cell counter as defined in claim 4 wherein said oscillator means includes means for manually adjusting the frequency of said periodic signal.

6. A blood cell counter as defined in claim 5 wherein said frequency is adjustable between about eighty and about three hundred sixty cycles per minute.

* * * * *

UNITED STATES PATENT AND TRADEMARK OFFICE
CERTIFICATE OF CORRECTION

PATENT NO. : 4,542,518

DATED : September 17, 1985

INVENTOR(S) : Thomas E. Anthony

It is certified that error appears in the above-identified patent and that said Letters Patent is hereby corrected as shown below:

Column 1, line 62:
      After "depress" insert --a--

Column 2, lines 1 and 2:
      "induced" should be --reduced--

Column 2, line 38:
      "comfirmations" should be --confirmations--

Column 2, line 67:
      "the" should be --of--

Signed and Sealed this

Twenty-fifth Day of February 1986

[SEAL]

Attest:

DONALD J. QUIGG

Attesting Officer

Commissioner of Patents and Trademarks